US011576268B2

(12) United States Patent
Park et al.

(10) Patent No.: US 11,576,268 B2
(45) Date of Patent: Feb. 7, 2023

(54) DISPLAY DEVICE AND METHOD OF MANUFACTURING THE SAME

(71) Applicant: Samsung Display Co., LTD., Yongin-si (KR)

(72) Inventors: Sang Hyo Park, Suwon-si (KR); Han Sun Ryou, Seoul (KR); Seung Hwa Ha, Hwaseong-si (KR); Min Sung Kim, Hwaseong-si (KR); Hyo Yul Yoon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 297 days.

(21) Appl. No.: 16/901,649

(22) Filed: Jun. 15, 2020

(65) Prior Publication Data
US 2021/0120683 A1 Apr. 22, 2021

(30) Foreign Application Priority Data

Oct. 22, 2019 (KR) .......................... 10-2019-0131627

(51) Int. Cl.
B32B 3/04 (2006.01)
H05K 5/00 (2006.01)
(Continued)

(52) U.S. Cl.
CPC ............. H05K 5/0017 (2013.01); B32B 3/04 (2013.01); B32B 7/12 (2013.01); B32B 27/06 (2013.01);
(Continued)

(58) Field of Classification Search
CPC ............ B32B 7/12; B32B 3/085; H05K 1/028
See application file for complete search history.

(56) References Cited

U.S. PATENT DOCUMENTS

2017/0271616 A1* 9/2017 Choi .................... H01L 51/0097
2019/0173030 A1* 6/2019 Kim .................... H01L 27/3244
(Continued)

FOREIGN PATENT DOCUMENTS

| JP | 20193099 A | 1/2019 |
| KR | 1020170015599 A | 2/2017 |
| KR | 1020190081264 | 7/2019 |

OTHER PUBLICATIONS

The Extended European Search Report—European Application No. EP 20196368.3 dated Feb. 16, 2021, citing references listed within.

Primary Examiner — Elizabeth E Mulvaney
(74) Attorney, Agent, or Firm — Cantor Colburn LLP

(57) ABSTRACT

A display device, including a folding region, and first and second non-folding regions at opposing sides of the folding region, includes: a display module; a support member on the display module; and a bonding layer between the display module and the support member. The support member includes a first support member in the first non-folding region and a part of the folding region, and a second support member in the second non-folding region and a part of the folding region. The bonding layer is over the folding region and the first and second non-folding regions. The bonding layer includes first to third portions in the first non-folding region, in the second non-folding region, and in the folding region, respectively. Adhesive force of the first portion to the support member is less than adhesive force of the second portion to the first support member or the second support member.

20 Claims, 21 Drawing Sheets

(51) Int. Cl.
  *B32B 7/12* (2006.01)
  *B32B 27/06* (2006.01)
  *B32B 27/28* (2006.01)
  *B32B 27/40* (2006.01)
  *B32B 37/12* (2006.01)
  *B32B 37/18* (2006.01)
  *H01L 51/00* (2006.01)

(52) U.S. Cl.
  CPC ............ *B32B 27/281* (2013.01); *B32B 27/40* (2013.01); *B32B 37/12* (2013.01); *B32B 37/182* (2013.01); *H01L 51/0097* (2013.01); *B32B 2037/1253* (2013.01); *B32B 2457/206* (2013.01)

(56) References Cited

U.S. PATENT DOCUMENTS

2019/0305238 A1    10/2019  Shin et al.
2020/0022267 A1*  1/2020  Han ...................... B32B 27/065

* cited by examiner

DISPLAY DEVICE AND METHOD OF MANUFACTURING THE SAME

This application claims priority to Korean Patent Application No. 10-2019-0131627, filed on Oct. 22, 2019, and all the benefits accruing therefrom under 35 U.S.C. § 119, the content of which in its entirety is herein incorporated by reference.

BACKGROUND

1. Field

The invention relates to a display device and a method of manufacturing the display device, and more particularly, to a display device which is switchable between a folded state and an unfolded state and a method of manufacturing the display device.

2. Description of the Related Art

A display device is a device for displaying an image, and typically includes a display panel such as an organic light emitting display panel or a liquid crystal display panel.

Recently, a mobile electronic device may include a display device for providing an image to a user. A mobile electronic device having a larger display screen while having a volume or thickness equal to or smaller than a conventional electronic device may have a relatively great weight, and a foldable display device or a bendable display device, having a structure that can be folded and unfolded to provide a larger screen only at the time of use, has been developed.

SUMMARY

An embodiment of the invention provides a display device in which stepped visibility in a folding area is reduced.

According to an embodiment, a display device, in which a folding region, a first non-folding region located at a side of the folding region, and a second non-folding region located at another side of the folding region are defined, includes: a display module; a support member disposed on the display module; and a bonding layer disposed between the display module and the support member. In such an embodiment, the support member includes a first support member disposed in the first non-folding region and a part of the folding region, and a second support member disposed in the second non-folding region and a part of the folding region, the bonding layer is disposed over the folding region, the first non-folding region, and the second non-folding region, the bonding layer includes a first portion disposed in the first non-folding region, a second portion disposed in the second non-folding region, and a third portion disposed in the folding region, and an adhesive force of the first portion to the support member is less than each of an adhesive force of the second portion to the first support member and an adhesive force of the third portion to the second support member.

In an embodiment, the bonding layer may further include a photoinitiator, and a density of the photoinitiator in the third portion may be less than each of a density of the photoinitiator in the first portion and a density of the photoinitiator in the second portion.

In an embodiment, the photoinitiator may react with light in a wavelength band of about 200 nanometers (nm) to about 350 nm.

In an embodiment, the display module may include a display panel and a buffer member disposed between the display panel and the bonding layer, and the buffer member may have a thickness in a range of about 100 micrometers ($\mu$m) to about 300 $\mu$m, and the bonding layer may have a thickness in a range of 5 $\mu$m to 50 $\mu$m.

In an embodiment, the display device may further include a support substrate disposed between the bonding layer and the buffer member, where the support substrate may be disposed over the folding region, the first non-folding region, and the second non-folding region, and the support substrate may be in contact with the bonding layer.

In an embodiment, the support substrate may include polyimide or polyurethane.

In an embodiment, the display device may further include an upper bonding layer disposed between the buffer member and the support substrate, where the buffer member and the support substrate may be coupled with each other through the upper bonding layer.

In an embodiment, each of the first support member and the second support member may be coupled with the display module through the bonding layer.

In an embodiment, the first support member and the second support member may be spaced apart from each other by a predetermined distance in the folding region.

In an embodiment, an adhesive force between the third portion and the support member in the folding region may be less than adhesive force between the third portion and the display module in the folding region.

In an embodiment, when the display device in a folded state, the first support member may be attached to the first portion, may be separated from the third portion, may be attached to the second portion, and may be separated from the third portion.

In an embodiment, a modulus of the third portion may be greater than each of a modulus of the first portion and a modulus of the second portion.

According to another embodiment, a method of manufacturing a display device, includes providing a target panel in which a folding region, a first non-folding region located at a side of the folding region, and a second non-folding region located at another side of the folding region are defined, and providing a buffer member on the target panel; providing a bonding layer on the buffer member; masking a portion of the bonding layer overlapping the first non-folding region and the second non-folding region; and irradiating the folding region with an ultraviolet light.

In an embodiment, the providing the bonding layer on the buffer member may include: providing a bonding layer on a substrate; providing a release film on the bonding layer; and removing the substrate and attaching an exposed surface of the bonding layer to the buffer member.

In an embodiment, the method may further include heating the bonding layer after the providing the bonding layer on the substrate and before the providing the release film on the bonding layer.

In an embodiment, The method may further include forming a first support member on the other surface of the bonding layer in the first non-folding region and forming a second support member on the other surface of the bonding layer in the second non-folding region after the attaching of one surface of the exposed bonding layer onto the buffer member.

In an embodiment, the providing the bonding layer on the buffer member may include: providing a bonding layer on a substrate; providing a release film on the bonding layer; and attaching the substrate onto the buffer member through an upper bonding layer.

In an embodiment, the bonding layer may include a photoinitiator.

In an embodiment, a density of the photoinitiator in a portion of the bonding layer overlapping the folding region may be less than a density of the photoinitiator in the portion of the bonding layer overlapping the first non-folding region and the second non-folding region.

In an embodiment, a modulus of the photoinitiator in a portion of the bonding layer overlapping the folding region may be greater than a modulus of the photoinitiator in the portion of the bonding layer overlapping the first non-folding region and the second non-folding region.

BRIEF DESCRIPTION OF THE DRAWINGS

The above and other features of the invention will become more apparent by describing in detail exemplary embodiments thereof with reference to the attached drawings, in which.

DETAILED DESCRIPTION

Figure 1:
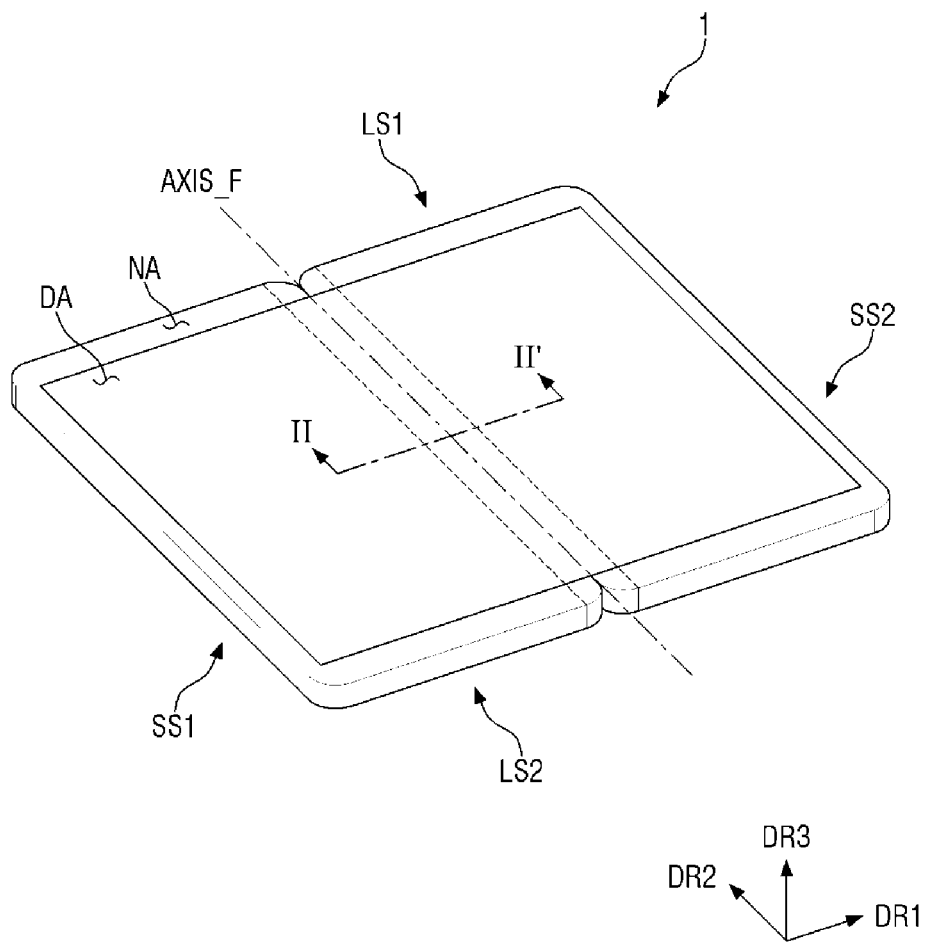
FIG. 1 is a perspective view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or" As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described with reference to the accompanying drawings.

Figure 2:
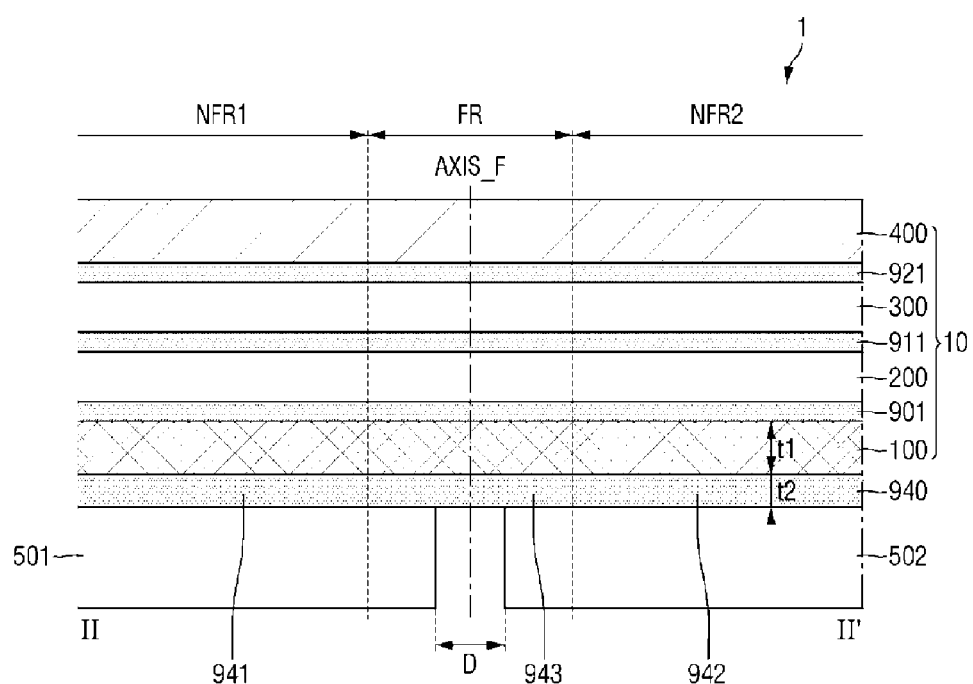
FIG. 2 is a cross-sectional view taken along the line II-IF of FIG. 1.
Figure 3:
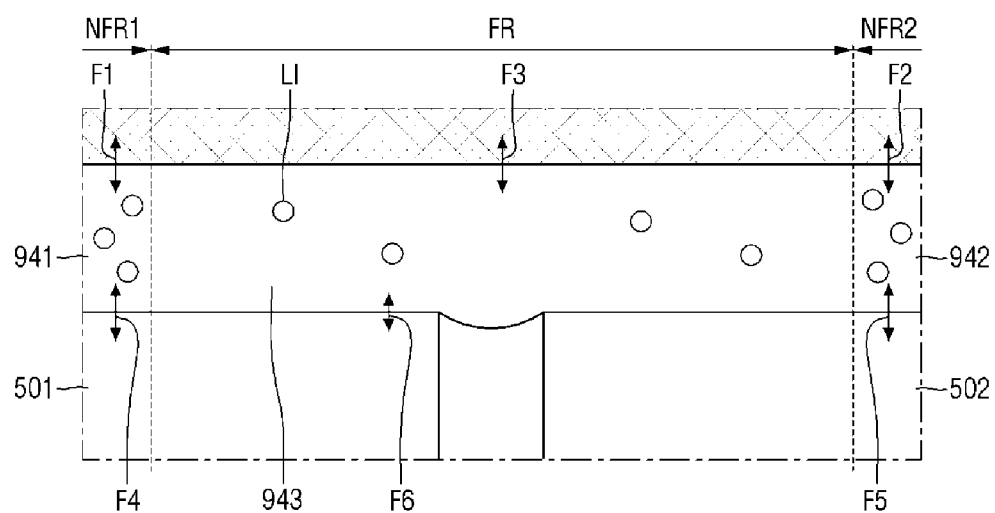
FIG. 3 is a partially enlarged view of FIG. 2.
Figure 4:
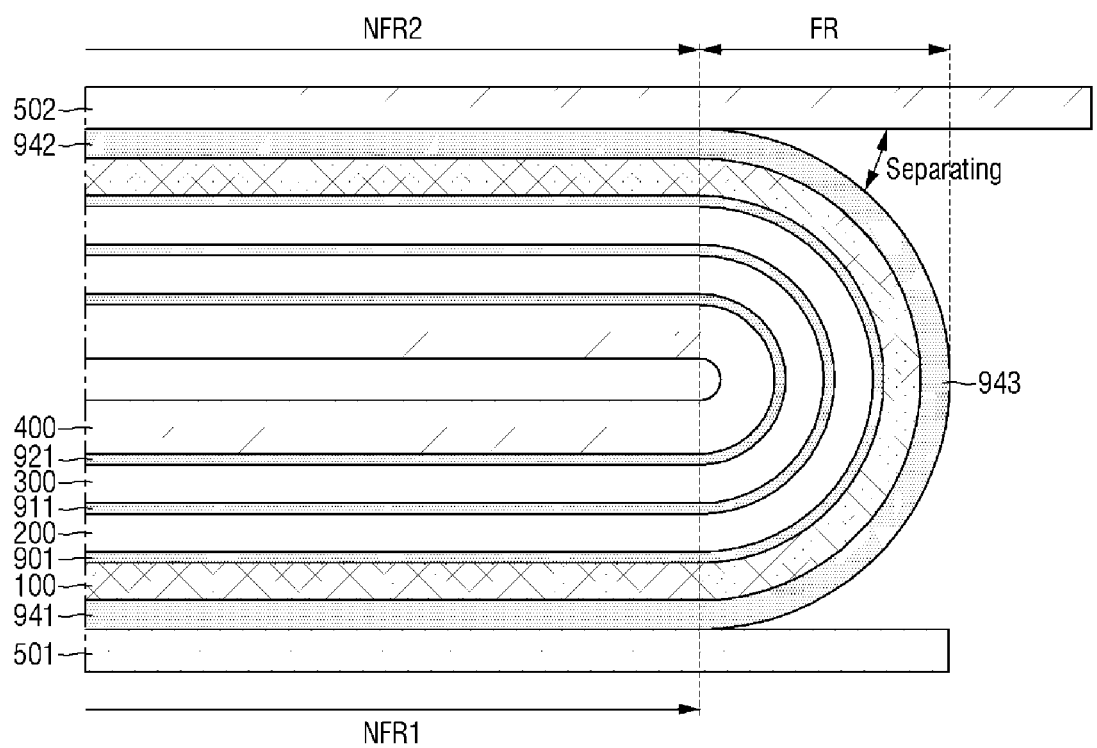
FIG. 4 is a cross-sectional view illustrating the display device in a folded state according to an embodiment.

FIG. 1 is a perspective view of a display device according to an embodiment, FIG. 2 is a cross-sectional view taken along the line II-IF of FIG. 1, FIG. 3 is a partially enlarged view of FIG. 2, and FIG. 4 is a cross-sectional view illustrating the display device in a folded state according to an embodiment.

Referring to FIGS. 1 to 4, an exemplary embodiment of a display device 1 may be a flexible (or foldable) display device. As used herein, foldable may refer to a flexible state, and specifically is a term designated by including bendable and rollable. Furthermore, the folding should be interpreted as including both "partially" folding, "entirely" folding, "in" folding, and "out" folding.

The display device 1 may include a folding axis AXIS_F that traverses the upper and lower sides of the display device in a plan view in a thickness direction of the display device 1. The display device may be folded based on the folding axis AXIS_F.

The display device 1 may have a substantially planar rectangular shape. The display device 1 may have a rectangular shape having vertically planar edges or a rectangular shape having rounded edges. The display device 1 may include four edges LS1, LS2, SS1, and SS2. The display device 1 may include long-side edges LS1 and LS2 and short-side edges SS1 and SS2. In one embodiment, for example, the long-side edges LS1 and LS2 may extend in a first direction DR1, and the short-side edges SS1 and SS2 may extend in a second direction DR2. A third direction DR3 may be a direction perpendicular to the first and second directions DR1 and DR2 or the thickness direction of the display device 1.

In an embodiment, as shown in FIG. 1, the folding axis AXIS_F may extend in a direction traversing the long-side edges LS1 and LS2, for example, in the second direction DR2. In such an embodiment, the long-side edges LS1 and LS2 of the display device 1 may be folded. In an alternative embodiment, the folding axis AXIS_F may extend to traverse the short-side edges SS1 and SS2. In such an embodiment, the short-side edges SS1 and SS2 of the display device 1 may be folded. Hereinafter, for convenience of description, the embodiments where the folding axis AXIS_F extends to traverse the long-side edges LS1 and LS2 will be described in detail. The folding axis AXIS_F may traverse the center portion of each long-side edges LS1, LS2, but the invention is not limited thereto.

As used herein, the terms "upper portion" and "upper surface" in the thickness direction refer to a display direction or the third direction DR3, and "lower portion" and "lower surface" refer to a direction opposite to the display direction, unless otherwise defined. In addition, the terms "upper", "lower", "left", and "right" in a plan view represent directions when viewed from a top plan view or a plan view in the third direction DR3 based on the display surface at a correct position.

The display device 1 may include a display area DA and a non-display area NA disposed around the display area DA. The display area DA is an area where an image is displayed, and the non-display area NA is an area where an image is not displayed. The display area DA may be located at a center portion of the display device 1. In a state where the display device 1 is folded, regions in the display area DA divided by the folding axis AXIS_F may overlap each other, and in a state where the display device 1 is unfolded again, an image may be displayed in a state where the respective regions in the display area DA are unfolded.

A groove (for example, a notch) recessed downward/upward on a plane is formed in a region adjacent to the first long-side edge LS1 and second long-side edge LS2 of the display device 1, each meeting the folding axis AXIS_F, and a hinge member (not illustrated) or the like for state switching may be coupled to the recessed portion. However, the invention is not limited thereto.

Referring to FIG. 2, an embodiment of the display device 1 may be divided into a folding region FR and non-folding regions NFR1 and NFR2 based on the folding axis AXIS_F.

In such an embodiment, the display device 1 may include a folding region FR located at a center portion of the display device and including the folding axis AXIS_F, and non-folding regions NFR1 and NFR2 spaced apart from each other with the folding region therebetween. The first non-folding region NFR1 may be disposed at one side of the folding region FR in the first direction DR1, and the second non-folding region NFR2 may be disposed at the other side of the folding region FR in the first direction DR1.

The folding region FR may be a region where the display device 1 is folded or bent with a predetermined curvature in the folding direction, and the non-folding regions NFR1 and NFR2 may be regions where the display device 1 is not folded. Each of the non-folding regions NFR1 and NFR2 may be a flat region entirely located on a same plane, or may include a partially bent region without limitations.

The display device 1 may include a flexible (display) module 10, as shown in FIG. 2. The flexible module 10 may include a plurality of laminated members. The flexible module 10 may include a display panel 200, a lower functional layer 100 disposed under the display panel 200, an upper functional layer 300 disposed over the display panel 200, and a window 400 disposed over the upper functional layer 300.

The lower functional layer 100 may be disposed at a bottom portion of the flexible module 10. The lower functional layer 100 may include at least one functional layer. Each of the at least one functional layer may be a layer that performs a buffering function, a heat dissipation function, an electromagnetic wave blocking function, a grounding function, a strength enhancing function, a support function, a pressure sensing function, a digitizing function, or the like. The lower functional layer 100 may be defined by a single functional layer. However, the invention is not limited thereto, and lower functional layer 100 may have a multi-layer structure including or defined by different functional layers laminated one on another.

In an embodiment, the lower functional layer 100 may include a buffer member. The buffer member may prevent the impact from an outside (for example, the downward direction of the lower functional layer 100) from being transmitted to the display panel 200. The buffer member may include or be formed of a foam material, for example, polyurethane ("PU"), thermoplastic polyurethane ("TPU"), silicon (Si), or polydimethylacrylamide ("PDMA").

The lower functional layer 100 may have lower light transmittance than a plurality of members disposed over the display panel 200 to be described later. The layers disposed over the display panel 200 may have relatively high light transmittance to transmit the light emitted from the display area upward. In contrast, the lower functional layer 100 may have relatively low light transmittance to block the light from the display area downward.

A thickness t1 of the lower functional layer 100 (also referred to as a first thickness t1) may be in a range of about 100 micrometers (μm) to about 300 μm. When the first thickness t1 of the lower functional layer 100 is equal to or greater than about 100 μm, at the time of folding the display device 1, the folding stress occurring in the folding region FR may be alleviated. When the first thickness t1 of the lower functional layer 100 is equal to or less than about 300 μm, the display device 1 may be allowed to have a thin thickness.

The display panel 200 may be disposed over the lower functional layer 100.

The display panel 200 may display an image by an input data signal. In an exemplary embodiment the display panel 200 may be an organic light emitting display panel, a liquid crystal display panel, a plasma display panel, an electrophoretic display panel, an electrowetting display panel, a quantum dot light emitting display panel, or a micro light emitting diode ("LED") display panel, for example. Hereinafter, for convenience of description, embodiments where the display panel 200 is an organic light emitting display panel will be described in detail.

In an embodiment, the display panel 200 may include a flexible substrate including a flexible polymer material such as polyimide ("PI"). In such an embodiment, the display panel 200 may be bent, warped, folded, or rolled. The display panel 200 may have a shape similar to the planar shape of the display device 1.

A plurality of pixels PX may be arranged in the display area DA of the display panel 200, and signal lines and drive circuits for applying signals to the respective pixels PX may be arranged in the non-display area NA of the display panel 200. In an embodiment, a black matrix having a shape of a rectangular frame in a plan view may be provided in the non-display area NA.

The pixel PX may include a light emitting layer and a circuit layer for controlling the amount of light emitted from the light emitting layer. The circuit layer may include a plurality lines, a plurality of electrodes, and a transistor. In an embodiment, the light emitting layer may include an organic light emitting material. The light emitting layer may be encapsulated by an encapsulation film. The encapsulation film may encapsulate the light emitting layer to prevent moisture and the like from inflowing from the outside. The encapsulation film may be an inorganic single-layer film or an inorganic multi-layer film, or may be a laminated film in which inorganic films and organic films are alternately laminated.

The upper functional layer 300 may be disposed over the display panel 200.

The upper functional layer 300 may include at least one functional layer. Each of the at least one functional layer may be a layer that performs a touch sensing function, a color filtering function, a color conversion function, a polarization function, an anti-reflection function or a biometric information recognition function (for example, a fingerprint recognition function). The upper functional layer 300 may include, for example, an anti-reflection member. The functional layer may be a sheet layer, a film layer, a thin film layer, a coating layer, a panel, or a plate. The upper functional layer 300 may be defined by a single functional layer. However, the invention is not limited thereto, and the upper functional layer 300 may have a multi-layer structure including or defined by a different functional layers laminated one on another.

The window 400 may be disposed over the upper functional layer 300.

The window 400 covers and protects the underlying members 100, 200, and 300. The window 400 may include or be made of a glass, quartz, or the like. The thickness of the window 400 may be less than about 100 μm. When the thickness of the window 400 is less than 100 μm, stress is reduced at the time of folding, and degree of deformation of a structure may be mitigated even if a folded state and an unfolded state are repeated. In an alternative embodiment, the window may include a chemically reinforced ultrathin glass ("UTG").

The flexible module 10 may include a plurality of adhesive films, e.g., first to third adhesive films 901, 911, and 921, for coupling the display panel 200, the lower functional layer 100, the upper functional layer 300 and the window 400 to one another. The first adhesive film 901 may be disposed between the lower functional layer 100 and the display panel 200 to attach the lower functional layer 100 and the display panel 200 to each other, the second adhesive film 911 may disposed between the display panel 200 and the upper functional layer 300 to attach the display panel 200 and the upper functional layer 300 to each other, and the third adhesive film 921 may be disposed between the upper functional layer 300 and the window 400 to attach the upper functional layer 300 and the window 400 to each other.

Each of the plurality of adhesive films 901, 911, 921 is a film having adhesive properties on both upper and lower surfaces thereof, and may be, for example, a pressure sensitive adhesive ("PSA") film, an optical clear adhesive ("OCA") film, or an optical clear resin ("OCR") film. Each of the plurality of adhesive films 901, 911, 921 may include an acrylic resin or a silicon-based resin. In an embodiment, each of the plurality of adhesive films 901, 911, 921 may have an elongation rate in a range of about 100% to about 1,000%.

The display device 1 may include support members 501 and 502 and a bonding layer 940.

In an embodiment, the support members 501 and 502 may prevent the display panel 200 from being bent by an external force or may alleviate the degree of bending (for example, bending angle or bending curvature radius). In such an embodiment, the support members 501 and 502 may maintain the display panel 200 in a relatively flat state even if an external force is applied.

The support members 501 and 502 may include a rigid or semi-rigid material. In an embodiment, the support members 501 and 502 may include a metal material such as stainless steel ("SUS") or aluminum, or a polymer material such as polymethyl metacrylate ("PMMA"), polycarbonate ("PC"), polyvinylalcohol ("PVA"), acrylonitrile-butadiene-styrene ("ABS"), or polyethylene terephthalate ("PET"). In one embodiment, for example, each of the support members 501 and 502 may be a stainless steel film having a thickness in a range of about 150 µm to about 200 µm. In one alternative embodiment, for example, each of the support members 501 and 502 may be an aluminum film having a thickness in a range of about 150 µm to about 200 µm.

In an embodiment, the support members 501 and 502 may be defined by a first support member 501 and a second support member 502, which are spaced apart from each other. The first support member 501 may be disposed over the first non-folding region NFR1 and a part of the folding region FR. The second support member 502 may be disposed over the second non-folding region NFR2 and a part of the folding region FR. The first support member 501 may be spaced apart from the second support member 502 by a predetermined distance D, based on the folding axis AXIS_F. In one embodiment, for example, the distance D between the first support member 501 and the second support member 502 may be about 50 µm or less. The support members 501 and 502 may also be referred to as support plates, jig plates, or the like.

The bonding layer 940 may be disposed over the folding region FR, the first non-folding region NFR1, and the second non-folding region NFR2. In an embodiment, the bonding layer 940 may be integrally formed as a single unitary unit under the flexible module 10.

The bonding layer 940 may include or be made of, for example, a PSA, an OCA, or an OCR.

A thickness t2 of the bonding layer 940 (also referred to as a second thickness t2) may be in range of about 5 µm to about 50 µm.

The bonding layer 940 may include a plurality of distinct portions or portions having different properties from one another. In an embodiment, as shown in FIG. 2, the bonding layer 940 may include a first portion 941 located in the first non-folding region NFR1, a second portion 942 located in the second non-folding region NFR2, and a third portion 943 located in the folding region FR. In such an embodiment, the boundary between the first portion 941 and the third portion 943 may be aligned with the boundary between the first non-folding region NFR1 and the folding region FR, and the boundary between the second portion 942 and the third portion 943 may be aligned with the boundary between the second non-folding region NFR2 and the folding region FR. The first portion 941 may overlap the first support member 501 in the thickness direction (or the third direction DR3), the second portion 942 may overlap the second support member 502 in the thickness direction, and the third portion 943 may partially overlap a portion of the first support member 501 and the second support member 502 extending to the folding region FR and also overlap a space between the first support member 501 and the second support member 502.

Referring to FIG. 3, in an embodiment, the bonding layer 940 may further include a photoinitiator LI. The photoinitiator L1 may be an initiator that reacts with light in a wavelength band of about 200 nanometers (nm) to about 350 nm. In such an embodiment, the bonding layer 940 includes the photoinitiator L1, as will be described later, such that a portion of the bonding layer 940, i.e., the portion overlapping folding region FR, may be irradiated with ultraviolet light in the wavelength band of about 200 nm to about 350 nm to form the third portion 943 having a greater modulus than each of the first portion 941 and the second portion 942.

In an embodiment, each of the modulus of the first portion 941 of the bonding layer 940 and the modulus of the second portion 942 thereof may be less than the modulus of the third portion 943 of the bonding layer 940. In such an embodiment, the modulus of the third portion 943 of the bonding layer 940 may be greater than each of the modulus of the first portion 941 and the modulus of the second portion 942. In such an embodiment, the rigidity or hardness of the third portion 943 may be greater than the rigidity or hardness of each of the first portion 941 and the second portion 942.

The modulus difference of the plurality of portions 941 to 943 of the bonding layer 940 may be related to a bonding force with the above-described support members 501 and 502. The bonding force may include adhesive force. The bonding layer 940 may include a surface contacting the lower functional layer 100 and an opposite surface opposite to the surface. A surface and an opposite surface of the first portion 941 may be in contact with the lower functional layer 100 and the first support member 501, respectively, a surface and an opposite surface of the second portion 942 may be in contact with the lower functional layer 100 and the second support member 502, respectively, and a surface and an opposite surface of the third portion 943 may be in contact with the lower functional layer 100 and the support members 501 and 502, respectively.

In an embodiment, in a state where the surface of the bonding layer 940 is coupled to the lower functional layer 100, the above-described ultraviolet light irradiation process may be performed. The opposite surface of the portion irradiated with ultraviolet light, that is, the third portion 943, may have a smaller bonding force than the opposite surface of each of the first portion 941 and the second portion 942.

In an embodiment, a first bonding force F1 (or first adhesive force) may be applied between a surface of the first portion 941 of the bonding layer 940 and the lower function member 100, a second bonding force F2 (or second adhesive force) may be applied between a surface of the second portion 942 of the bonding layer 940 and the lower function member 100, a third bonding force F3 (or third adhesive force) may be applied between a surface of the third portion 943 of the bonding layer 940 and the lower function member 100, a fourth bonding force F4 (or fourth adhesive force) may be applied between an opposite surface of the first portion 941 of the bonding layer 940 and the first support member 501, a fifth bonding force F5 (or fifth adhesive force) may be applied between an opposite surface of the second portion 942 of the bonding layer 940 and the second support member 502, and a sixth bonding force F6 (or sixth adhesive force) may be applied between an opposite surface of the third portion 943 of the bonding layer 940 and first support member 501 or between the opposite surface of the third portion 943 of the bonding layer 940 and the second support member 502.

The first bonding force F1 may be substantially the same as the second bonding force F2.

Each of the fourth bonding force F4 and the fifth bonding force F5 may be greater than the sixth bonding force F6. In such an embodiment, as described above, the third portion 943 is irradiated with ultraviolet light or cured with ultraviolet light and thus the adhesive force of the opposite surface of the third portion 943 is decreased.

The sixth bonding force F6 may be less than the third bonding force F3. In an embodiment, as described above, since a surface of the third portion 943 is irradiated with ultraviolet light or cured with ultraviolet light in a state where the third portion 943 of the bonding layer 940 is coupled to the lower functional layer 100, the adhesive force of the opposite surface of the third portion 943 of the exposed bonding layer 940 is decreased, whereas the bonding force between the surface of the third portion 943 and the lower functional layer 100 may be maintained.

In an embodiment of the display device 1, a density of the photoinitiator LI of the third portion 943 may be less than a density of the photoinitiator LI of each of the first portion 941 and the second portion 942. Herein, the density of the photoinitiator L1 may refer to as the number of the particles of the photoinitiator L1 in a unit area of the bonding layer 940. In such an embodiment, the third portion is irradiated with ultraviolet light capable of reacting with the photoinitiator L1, and the first portion 941 and the second portion 942 are not irradiated with ultraviolet light through a masking process to be described later such that the density of the photoinitiator LI of the third portion 943 may become less than the density of the photoinitiator LI of each of the first portion 941 and the second portion 942.

Referring to FIG. 4, the folding region FR of the flexible module 10 and the bonding layer 940 may be folded with a predetermined curvature by an external force, but the non-folding regions NFR1 and NFR2 of the flexible module 10 and the bonding layer 940 may not be folded by an external force. In such an embodiment, the flexible module 10 and the bonding layer 940 may be located on the flat surfaces constituting a same plane in the non-folding regions NFR1 and NFR2, respectively.

When an external force is applied to one side of the display device 1, for example, the right side thereof along the folding direction (upward direction in FIG. 3), the folding region FR may be bent or folded, and the second non-folding region NFR2 may overlap or face the first non-folding region NFR1 after moving or rotating along the folding direction.

In an embodiment, where the support members 501 and 502 include or are made of a rigid material and are folded, bending stress may occur if the support members 501 and 502 attached to and the flexible module 10 are bent. The bending stress may be transmitted to the overlying flexible module 10 to cause defects.

Thus, it is desired that the support members 501 and 502 and the flexible module 10 are not bonded to each other in the folding region FR. In an embodiment, the bonding force (the sixth bonding force F6) between the third portion 943 of the bonding layer 940 disposed in the folding region FR of the supporting members 501 and 502 and each of the supporting members 501 and 502 may be weakened, so that, when folding the display device 1, a surface of the third portion 943 of the bonding layer 940 may be attached to the lower functional layer 100, and the opposite surface of the third portion 943 thereof may be separated from the support members 501 and 502.

Thus, in such an embodiment, bending stress due to the support members 501 and 502 may be effectively prevented from occurring in the folding region FR.

In an embodiment of the display device 1, the bonding layer 940 may be integrally formed as a single unitary unit and disposed over the folding region FR, the first non-folding region NFR1, and the second non-folding region NFR2. Thus, a step difference between the folding region FR and the adjacent non-folding regions NFR1 and NFR2, which may be viewed from an outside, may be prevented from occurring. In an embodiment, as described above with reference to FIGS. 2 and 3, the support members 501 and 502 are partially spaced apart from each other at the central portion of the folding region FR, so that the space therebetween may be viewed in an upward direction. In an embodiment of the display device 1, the bonding layer 940 may be disposed to overlap the space in the thickness direction, thereby preventing the space the support members 501 and 502 from being viewed or recognized from an outside.

Hereinafter, an embodiment of a method of manufacturing a display device will be described. In such an embodiment, the same or like components as those of the embodiments described above are referred to by the same reference numerals, and any repetitive detailed description thereof will be omitted or simplified.

Figure 5:
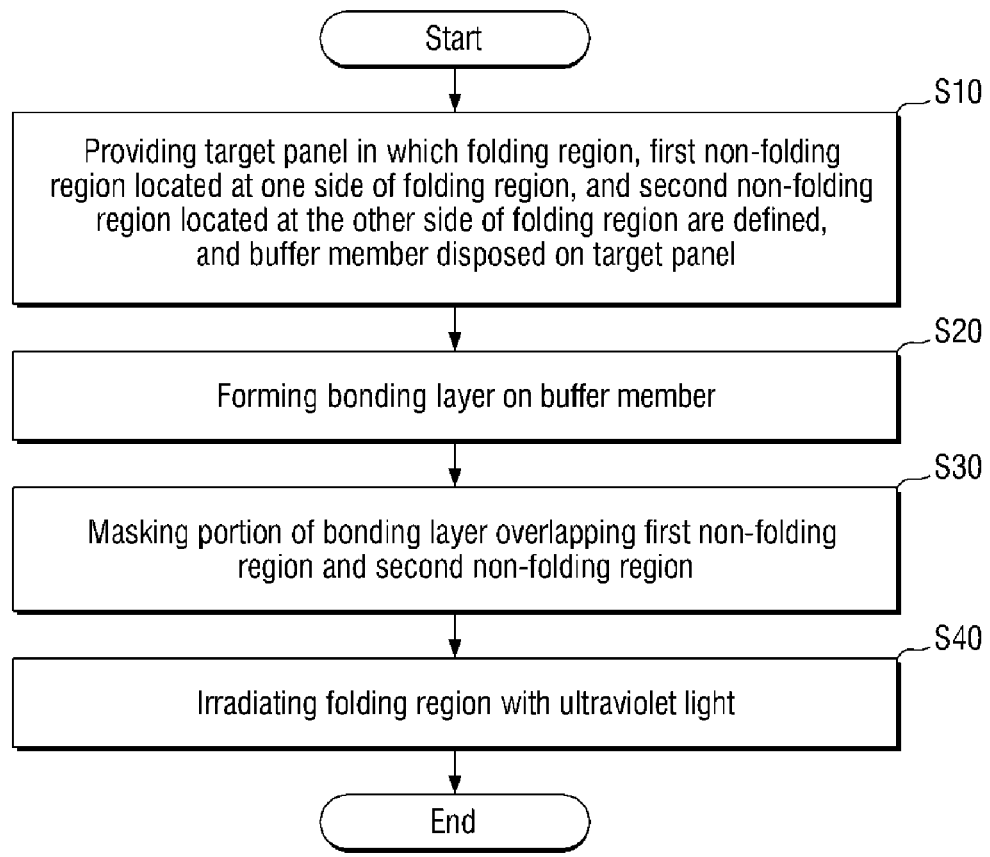
FIG. 5 is a flowchart illustrating a method of manufacturing a display device according to an embodiment.

FIG. 5 is a flowchart illustrating a method of manufacturing a display device according to an embodiment, and FIGS. 6 to 13 are cross-sectional views illustrating the process steps of a method of manufacturing a display device according to an embodiment.

Referring to FIG. 5, first, a target panel in which a folding region FR, a first non-folding region NFR1 located at one side of the folding region FR, and a second non-folding region NFR2 located at another side of the folding region FR are defined, and a buffer member disposed on the target panel are provided (S10).

The target panel may refer to a component substantially the same as that of the display panel 200 of FIG. 2, and the buffer member may refer to a component substantially the same as that of the lower functional layer 100 of FIG. 2.

Subsequently, a bonding layer is provided or formed on the buffer member 100 (S20).

One surface of the bonding layer (refer to '940*b*' of FIG. 10) may be attached to the lower surface of the buffer member 100.

The providing or forming the bonding layer 940*b* on the buffer member 100 (S20) may include a plurality of processes.

Figure 6:
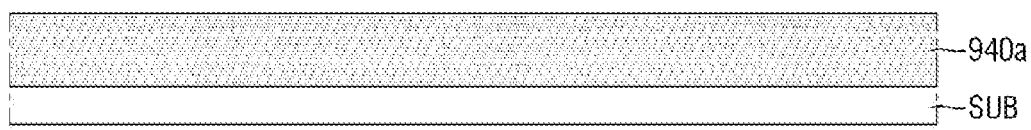
FIGS. 6 to 13 are cross-sectional views illustrating the process steps of a method of manufacturing a display device according to an embodiment.

Referring to FIG. 6, the providing or forming the bonding layer 940*b* on the buffer member 100 (S20) may include applying a bonding material 940*a* onto a substrate SUB.

The bonding material 940*a* may be a PSA, an OCA, or an OCR having adhesive properties at a surface and on an opposite surface thereof after heat is applied thereto, which will be described later. The bonding material 940*a* may further include the photoinitiator LI described above with reference to FIG. 3.

Figure 7:
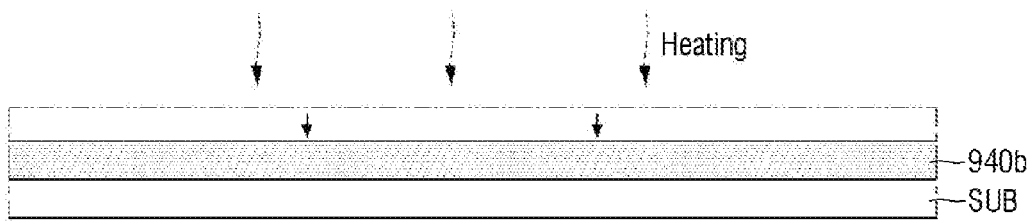

Referring to FIG. 7, after the applying the bonding material 940*a* onto the support substrate SUB, the bonding material 940*a* is heated to form a first bonding material 940*b*. The bonding material 940*a* may be a solution material in which an adhesive material is dispersed in a solvent. The bonding material 940*a* is heated to remove the solvent to form the first bonding material 940*b*.

Figure 8:
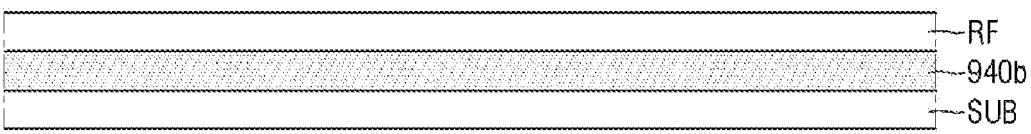

Subsequently, referring to FIG. 8, after the first bonding material 940*b* is formed, a release film RF is provided or formed on the first bonding material 940*b*. The release film RF may include or be made of at least one selected from PET, PC, and paper.

The support substrate SUB may be disposed on a surface of the first bonding material 940*b*, and the release film RF may be disposed on an opposite surface of the first bonding material 940*b*. A surface of the release film RF may contact the first bonding material 940*b*, and an opposite surface of the release film RF, which is opposite to the surface of the release film RF, may be exposed.

Figure 9:
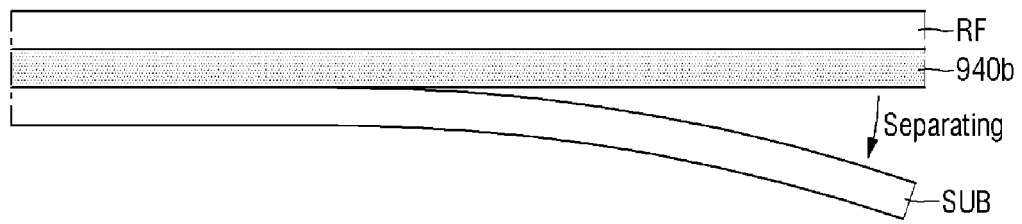

Subsequently, referring to FIG. 9, after the release film RF is provided or formed on the first bonding material 940*b*, the support substrate SUB is removed on from the opposite surface of the first bonding material 940*b*. Thus, the opposite surface of the first bonding material 940*b* may be exposed.

Subsequently, referring to FIGS. 5 and 10, the exposed opposite surface of the first bonding material 940b is attached to a surface of the buffer member 100 (S20).

Figure 10:
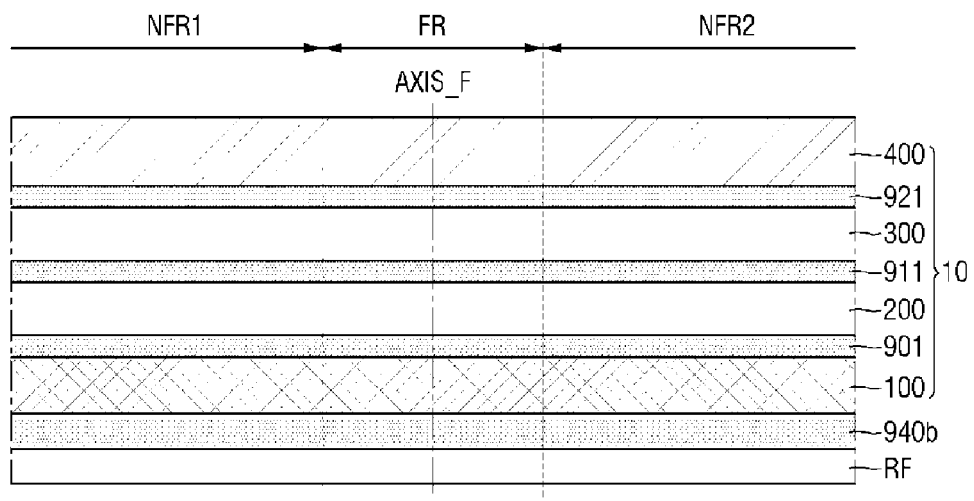

In an embodiment, as shown in FIG. 10, the release film RF may be attached to the surface of the first bonding material 940b.

Figure 11:
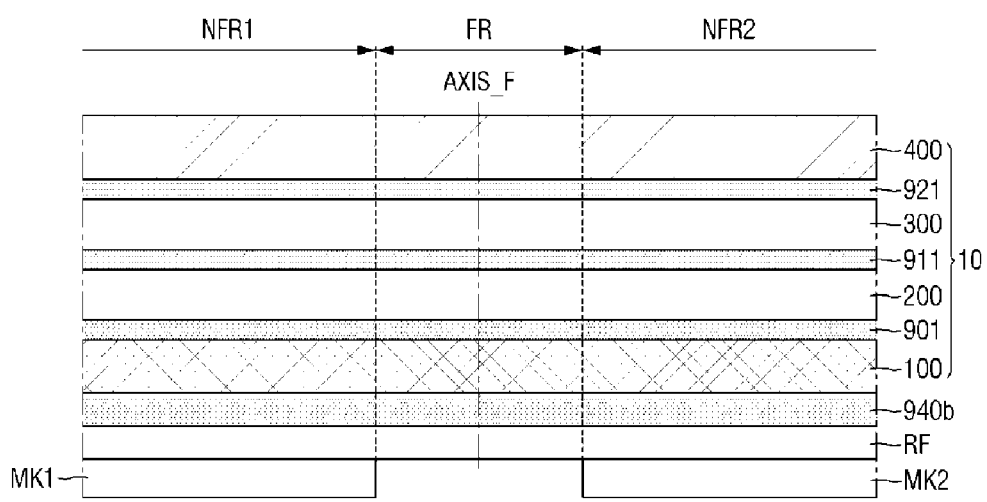

Subsequently, referring to FIGS. 5 and 11, a portion of the first bonding material 940b overlapping the first non-folding region NFR1 and second non-folding region NFR2 is masked (S30) or covered by a mask.

The masking the portion of the first bonding material 940b overlapping the first non-folding region NFR1 and second non-folding region NFR2 (S30) may include providing or forming a first masking member MK1 in the first non-folding region NFR1 of the exposed opposite surface of the release film RF, and providing or forming a second masking member MK2 in the second non-folding region NFR2 of the exposed opposite surface of the release film RF. Thus, a portion of the release film RF, i.e., the portion overlapping the folding region FR, may be exposed.

Figure 12:
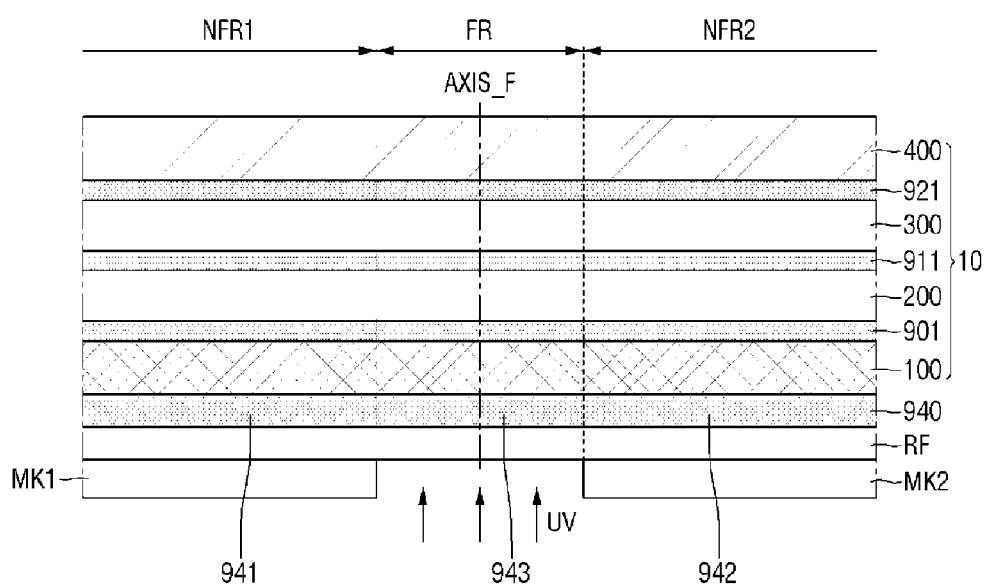
Figure 13:
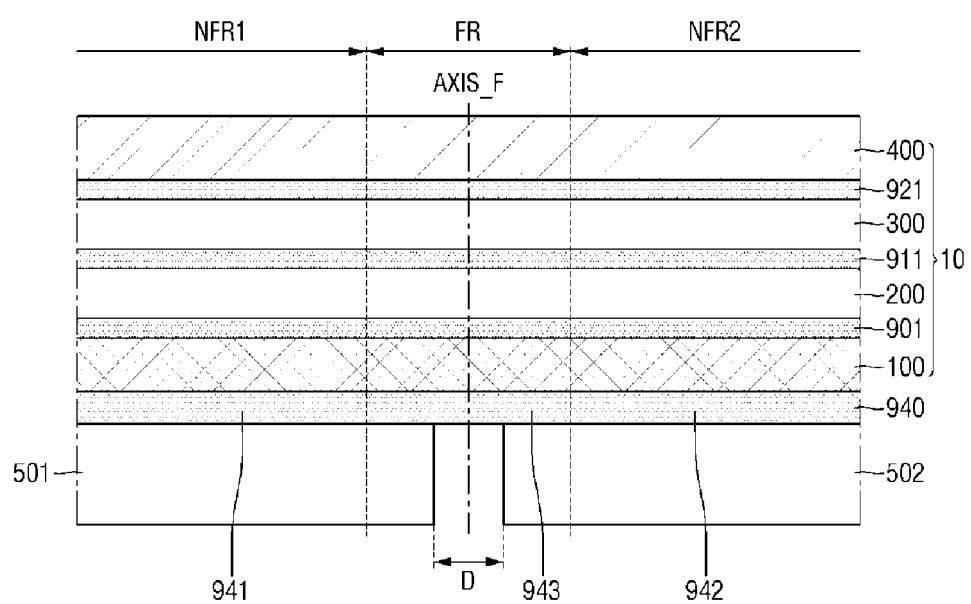
Figure 14:
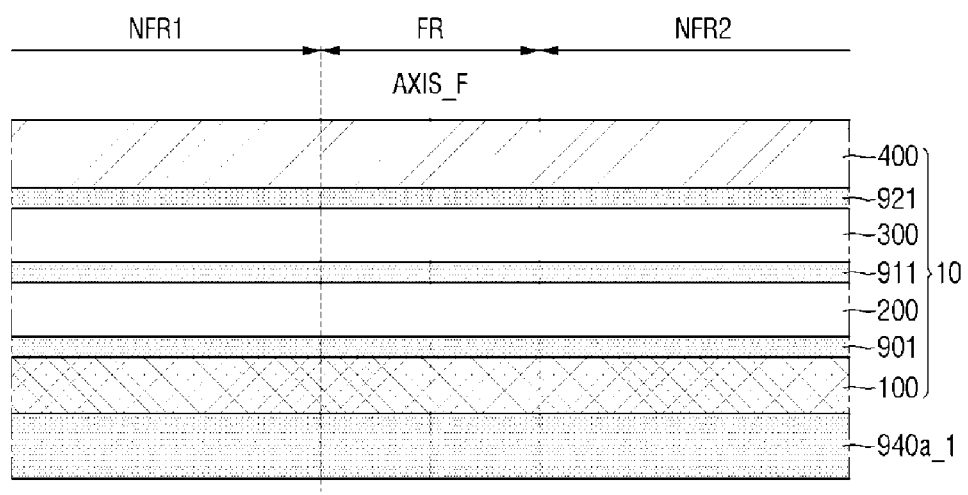
FIGS. 14 to 18 are cross-sectional views illustrating the process steps of a method of manufacturing a display device according to an alternative embodiment.

Subsequently, referring to FIGS. 5 and 12, the folding region FR is irradiated with ultraviolet light UV (S40).

The irradiating the folding region FR with ultraviolet light UV (S40) may include irradiating not only the folding region FR but also non-folding regions NFR1 and NFR2 with ultraviolet light UV. However, the ultraviolet light UV applied to the non-folding regions NFR1 and NFR2 is blocked by the first and second masking members MK1 and MK2, and thus the ultraviolet light UV may not reach a portion of the first bonding material 940b overlapping the first and second masking members MK1 and MK2.

The folding region FR is irradiated with ultraviolet light UV, thereby forming the bonding layer 940 described with reference to FIG. 3.

Subsequently, the masking members MK1 and MK2 and the release film RF are removed from the bonding layer 940.

Subsequently, a first support member 501 is provided or formed in the first non-folding region NFR1 on the opposite surface of the bonding layer 940 and a part of the folding region FR, and a second support member 502 is provided or formed in the second non-folding region NFR1 on the opposite surface of the bonding layer 940 and a part of the folding region FR.

In an embodiment, as described above, the bonding force (the sixth bond force F6) between each of the support members 501 and 502 and the third portion 943 of the bonding layer 940 disposed in the folding region FR of and each of the support members 501 and 502 is weakened, so that, at the time of folding, the surface of the third portion 943 of the bonding layer 940 is attached to the lower functional layer 100, and the opposite surface of the third portion 943 may be separated from the support members 501 and 502.

Thus, in the folding region FR, bending stress due to the support members 501 and 502 may be effectively prevented from occurring.

In an embodiment of the method of manufacturing a display device, the bonding layer 940 may be integrally formed as a single unitary unit over the folding region FR, the first non-folding region NFR1, and the second non-folding region NFR2. Thus, a step difference between the folding region FR and the adjacent non-folding regions NFR1 and NFR2, which may be viewed from an outside, may be prevented from occurring.

FIGS. 14 to 18 are cross-sectional views illustrating the process steps of a method of manufacturing a display device according to an alternative embodiment.

The embodiment of a method of manufacturing a display device shown in FIGS. 14 to 18 is substantially the same as the above-described method of manufacturing a display device except for forming a bonding layer on the buffer member.

In such an embodiment of the method of manufacturing a display device, a bonding material 940a_1 may be directly applied onto the buffer member 100.

The bonding material 940a_1 may be a PSA, an OCA, or an OCR having adhesive properties at a surface and an opposite surface thereof after a process of applying heat to be described later. The bonding material 940a_1 may further include the photoinitiator LI described above with reference to FIG. 3.

Figure 15:
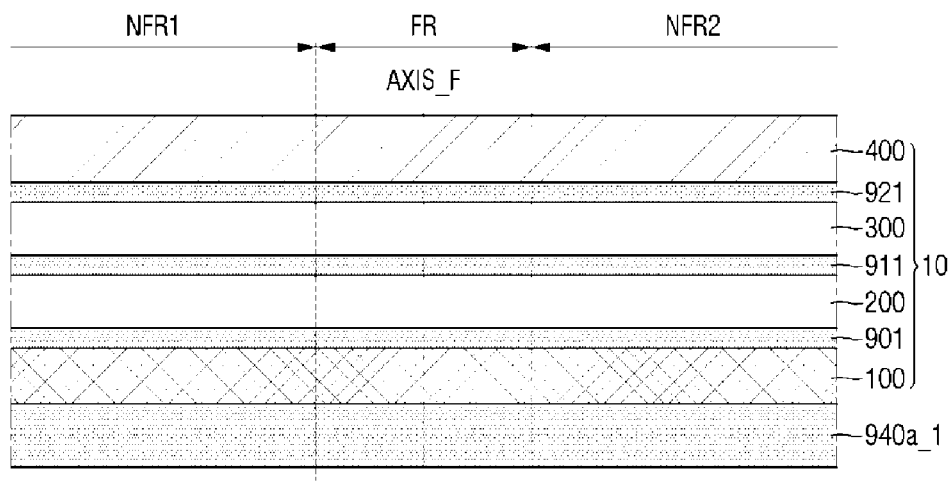

Referring to FIG. 15, after the directly applying the bonding material 940a_1 onto the support substrate SUB, the bonding material 940a_1 is heated to form a first bonding material 940b_1. The bonding material 940a_1 may be a solution material in which an adhesive material is dispersed in a solvent. The bonding material 940a_1 is heated to remove the solvent to form the first bonding material 940b_1.

Figure 16:
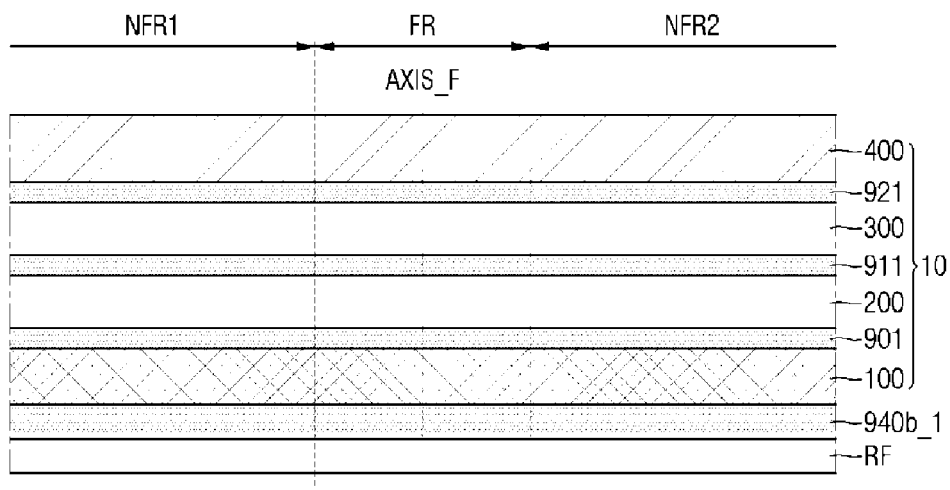

Subsequently, referring to FIG. 16, after the first bonding material 940b_1 is formed, a release film RF is provided or formed on the first bonding material 940b_1. The release film RF may include or be made of at least one selected from PET, PC, and paper.

The buffer member 100 may be disposed on a surface of the first bonding material 940b_1, and the release film RF may be disposed on an opposite surface of the first bonding material 940b_1. A surface of the release film RF may contact the first bonding material 940b_1, and an opposite surface of the release film RF, which is opposite to the surface of the release film RF, may be exposed.

Figure 17:
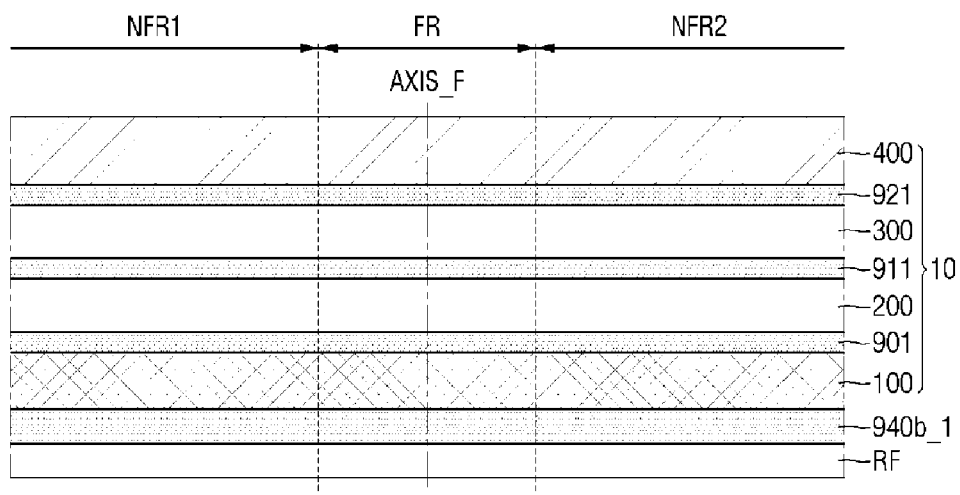

Subsequently, referring to FIG. 17, a portion of the first bonding material 940b_1 overlapping the first non-folding region NFR1 and second non-folding region NFR2 is masked.

The masking the portion of the first bonding material 940b_1 overlapping the first non-folding region NFR1 and second non-folding region NFR2 may include providing or forming a first masking member MK1 in the first non-folding region NFR1 of the exposed opposite surface of the release film RF, and providing or forming a second masking member MK2 in the second non-folding region NFR2 of the exposed opposite surface of the release film RF. Thus, the portion of the release film RF overlapping the folding region FR may be exposed.

Figure 18:
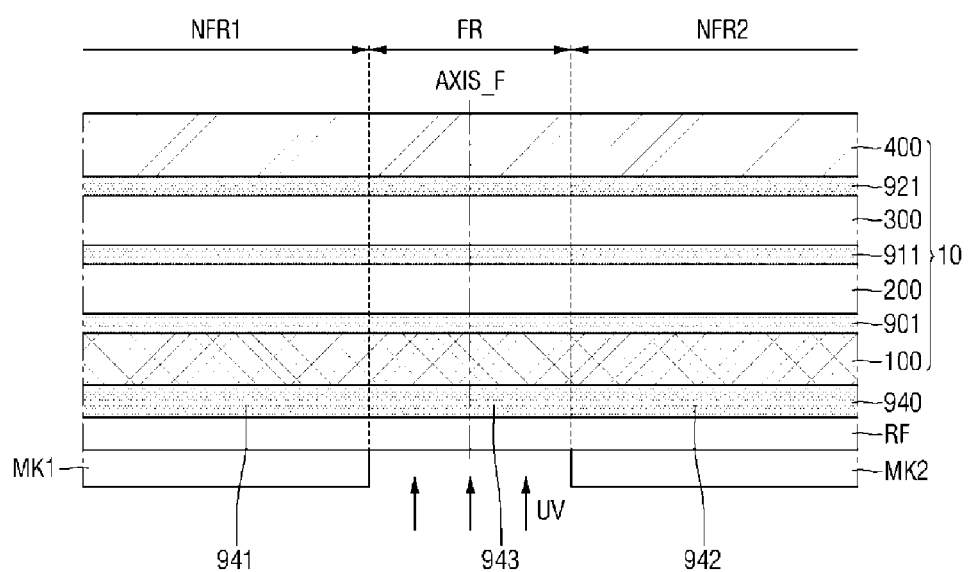

Subsequently, referring to FIG. 18, the folding region FR is irradiated with ultraviolet light UV.

The irradiating the folding region FR with ultraviolet light UV may include irradiating not only the folding region FR but also non-folding regions NFR1 and NFR2 with ultraviolet light UV. However, the ultraviolet light UV applied to the non-folding regions NFR1 and NFR2 is blocked by the first and second masking members MK1 and MK2, and thus the ultraviolet light UV may not reach a portion of the first bonding material 940b_1 overlapping the first and second masking members MK1 and MK2.

The folding region FR is irradiated with ultraviolet light UV, thereby forming the bonding layer 940 described with reference to FIG. 3.

Subsequently, the masking members MK1 and MK2 and the release film RF are removed from the bonding layer 940.

Subsequently, a first support member 501 is provided or formed in the first non-folding region NFR1 on the opposite surface of the bonding layer 940 and a part of the folding region FR, and a second support member 502 is provided or formed in the second non-folding region NFR1 on the opposite surface of the bonding layer 940 and a part of the folding region FR.

In such an embodiment, as described above, the bonding force (the sixth bond force F6) between each of the support members 501 and 502 and the third portion 943 of the bonding layer 940 disposed in the folding region FR of and each of the support members 501 and 502 is weakened, so that, at the time of folding, a surface of the third portion 943 of the bonding layer 940 is attached to the lower functional layer 100, and an opposite surface of the third portion 943 may be separated from the support members 501 and 502.

Thus, in the folding region FR, bending stress due to the support members 501 and 502 may be effectively prevented from occurring.

In such an embodiment of the method of manufacturing a display device, the bonding layer 940 may be integrally formed as a single unitary unit over the folding region FR, the first non-folding region NFR1, and the second non-folding region NFR2. Thus, a step difference between the folding region FR and the adjacent non-folding regions NFR1 and NFR2, which may be viewed or recognized from an outside, may be effectively prevented from occurring.

Figure 19:
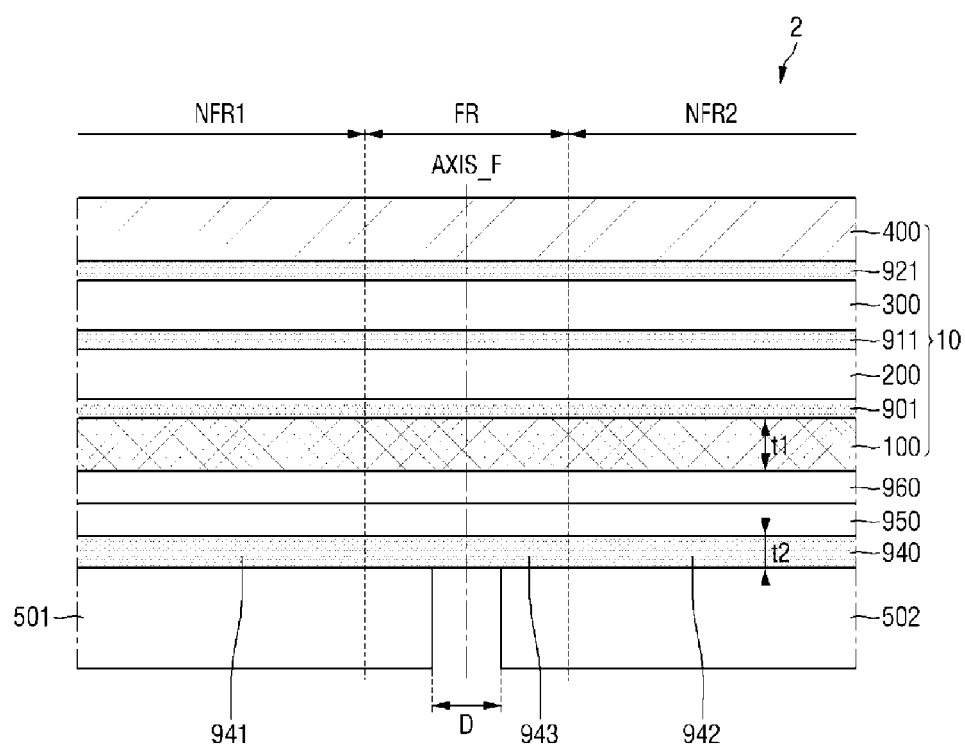
FIG. 19 is a cross-sectional view of a display device according to an alternative embodiment.

FIG. 19 is a cross-sectional view of a display device according to another alternative embodiment.

Referring to FIG. 19, a display device 2 is substantially the same as the display device 1 of FIG. 2 except that the display device 2 further includes a lower support substrate 950 between the lower functional layer 100 and the bonding layer 940 and a lower bonding layer 960 between the lower support substrate 950 and the lower functional layer 100.

In such an embodiment, as shown in FIG. 19, the display device 2 may include a lower support substrate 950 between the lower functional layer 100 and the bonding layer 940 and a lower bonding layer 960 between the lower support substrate 950 and the lower functional layer 100.

The lower support substrate 950 may include an organic insulating material. In one embodiment, for example, the organic insulating material may include at least one material selected from polyethersulphone ("PES"), polyacrylate ("PA"), polyarylate ("PAR"), polyetherimide ("PEI"), polyethylene napthalate ("PEN"), PET, polyphenylene sulfide ("PPS"), polyallylate, PI, PC, cellulose triacetate ("CAT"), cellulose acetate propionate ("CAP"), polyurethane ("PU"), and a combinations thereof.

In an embodiment, the lower support substrate 950 may include PU or PI.

In such an embodiment, the lower support substrate 950 and the bonding layer 940 may collectively define a single-sided tape. A surface of the bonding layer 940 may be attached to the lower support substrate 950, and an opposite surface of the bonding layer 940 may be attached to the underlying support members 501 and 502.

The single-sided tape including the lower support substrate 950 and the bonding layer 940 may be coupled with the lower functional layer 100 through the lower bonding layer 960. That is, the lower bonding layer 960 may serve to couple the lower functional layer 100 and the single-sided tape to each other.

The lower bonding layer 960, as a layer having adhesive properties on both upper and lower surfaces thereof, may include or be formed of a PSA, an OCA, or an OCR.

The lower bonding layer 960 may include acrylic resin or silicone resin. The lower bonding layer 960 may have an elongation rate in a range of about 100% to about 1000%.

FIGS. 20 to 24 are cross-sectional views illustrating the process steps of a method of manufacturing a display device according to another alternative embodiment.

The method of manufacturing a display device shown in FIGS. 20 to 24 is substantially the same as the above-described method of manufacturing a display device except for forming a bonding layer on the buffer member.

Figure 20:
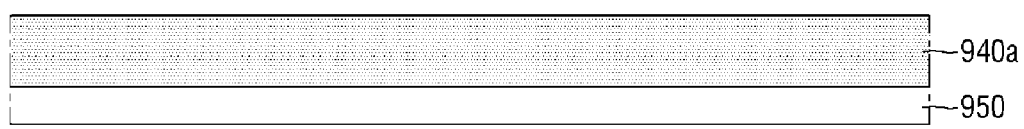
FIGS. 20 to 24 are cross-sectional views illustrating the process steps of a method of manufacturing a display device according to another alternative embodiment.

In an embodiment, referring to FIG. 20, the forming a bonding layer on the buffer member may include applying a bonding material 940a onto the lower support substrate 950.

The bonding material 940a may be a PSA, an OCA, or an OCR having adhesive properties at a surface and an opposite surface thereof after applying heat to be described later. The bonding material 940a may further include the photoinitiator LI described above with reference to FIG. 3.

Figure 21:
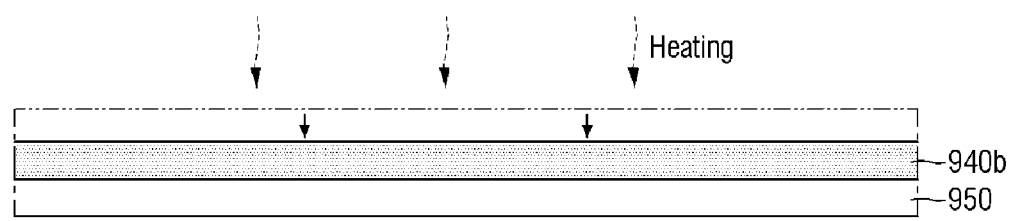

Referring to FIG. 21, after the applying the bonding material 940a onto the lower support substrate 950, the bonding material 940a is heated to form a first bonding material 940b. The bonding material 940a may be a solution material in which an adhesive material is dispersed in a solvent. The bonding material 940a is heated to remove the solvent to form the first bonding material 940b.

Figure 22:
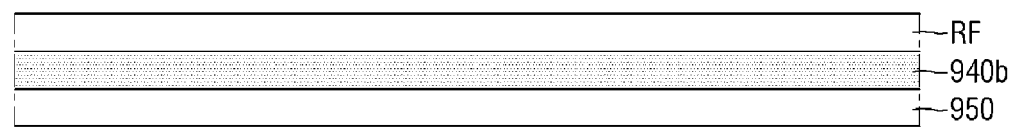

Subsequently, referring to FIG. 22, after the first bonding material 940b is formed, a release film RF is provided or formed on the first bonding material 940b. The release film RF may include or be made of at least one material selected from PET, PC, and paper.

The lower support substrate 950 may be disposed on one surface of the first bonding material 940b, and the release film RF may be disposed on the other surface of the first bonding material 940b. A surface of the release film RF may contact the first bonding material 940b, and an opposite surface of the release film RF, which is opposite to the surface of the release film RF, may be exposed.

Subsequently, referring to FIG. 23, after the release film RF is provided or formed on the first bonding material 940b, the upper surface of the lower support substrate 950 under which the first bonding material 940b is formed is attached to a surface of the buffer member 100 through the lower bonding layer 960.

Figure 23:
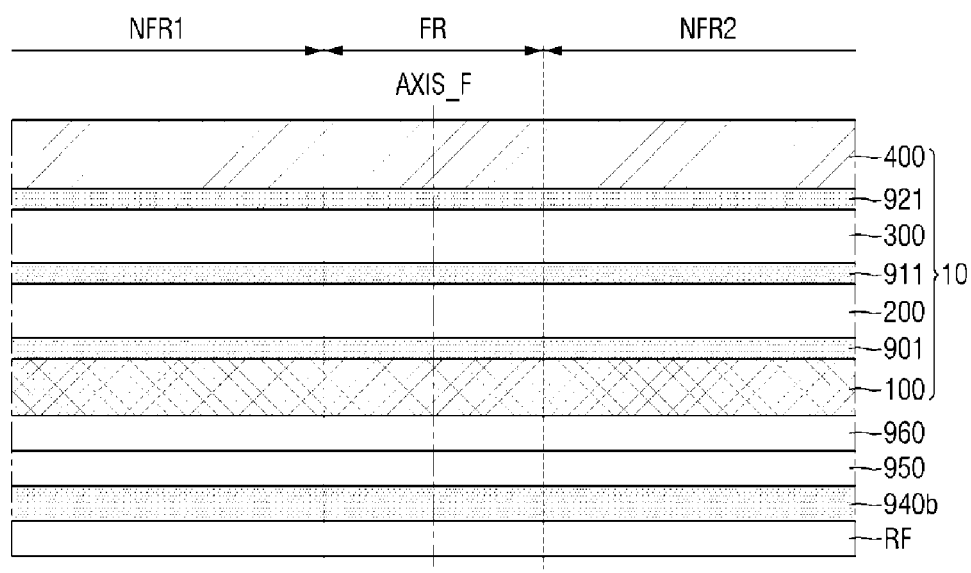

In an embodiment, as shown in FIG. 23, the release film RF may be attached to an opposite surface of the first bonding material 940b.

Figure 24:
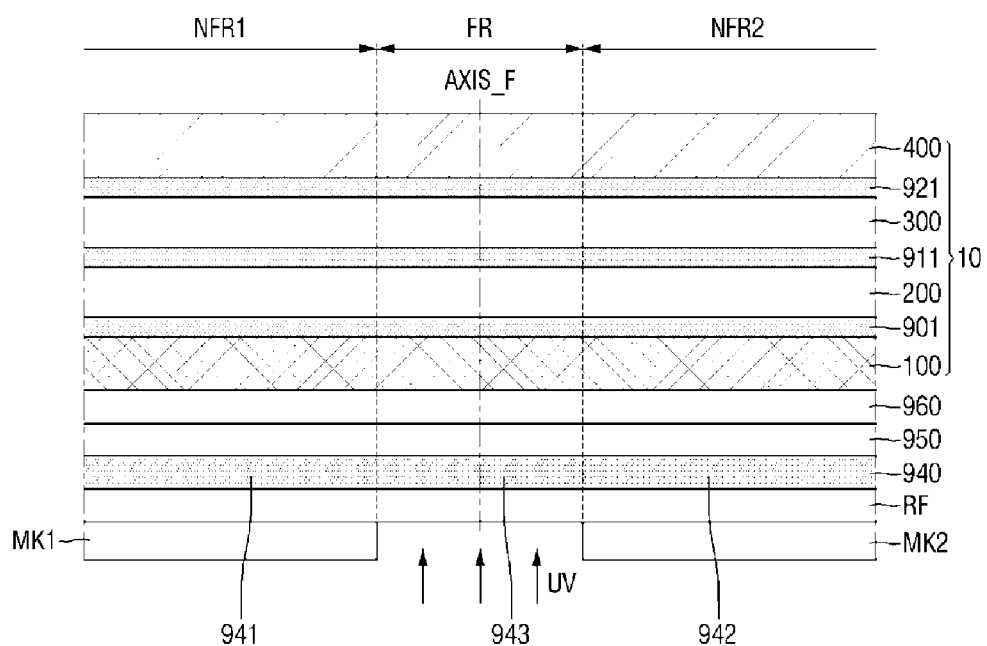

Subsequently, referring to FIG. 24, a portion of the first bonding material 940b overlapping the first non-folding region NFR1 and second non-folding region NFR2 is masked.

The masking the portion of the first bonding material 940b overlapping the first non-folding region NFR1 and second non-folding region NFR2 may include providing or forming a first masking member MK1 in the first non-folding region NFR1 of the exposed opposite surface of the release film RF, and providing or forming a second masking member MK2 in the second non-folding region NFR2 of the exposed opposite surface of the release film RF. Thus, the portion of the release film RF overlapping the folding region FR may be exposed.

Subsequently, the folding region FR is irradiated with ultraviolet light UV.

The irradiating the folding region FR with ultraviolet light UV may include irradiating not only the folding region FR but also non-folding regions NFR1 and NFR2 with ultraviolet light UV. However, the ultraviolet light UV applied to the non-folding regions NFR1 and NFR2 is blocked by the first and second masking members MK1 and MK2, and thus the ultraviolet light UV may not reach a portion of the first bonding material 940*b* overlapping the first and second masking members MK1 and MK2.

The folding region FR is irradiated with ultraviolet light UV, thereby forming the bonding layer 940 described with reference to FIG. 3.

Subsequently, the masking members MK1 and MK2 and the release film RF are removed from the bonding layer 940.

Subsequently, a first support member 501 is provide or formed in the first non-folding region NFR1 on the opposite surface of the bonding layer 940 and a part of the folding region FR, and a second support member 502 is formed in the second non-folding region NFR1 on the opposite surface of the bonding layer 940 and a part of the folding region FR.

In an embodiment, as described above, the bonding force (the sixth bond force F6) between each of the support members 501 and 502 and the third portion 943 of the bonding layer 940 disposed in the folding region FR of and each of the support members 501 and 502 is weakened, so that, at the time of folding, a surface of the third portion 943 of the bonding layer 940 is attached to the lower functional layer 100, and an opposite surface of the third portion 943 may be separated from the support members 501 and 502.

Thus, in the folding region FR, bending stress due to the support members 501 and 502 may be effectively prevented from occurring.

In such an embodiment of the method of manufacturing a display device, the bonding layer 940 may be integrally formed as a single unitary unit over the folding region FR, the first non-folding region NFR1, and the second non-folding region NFR2. Thus, a step difference between the folding region FR and the adjacent non-folding regions NFR1 and NFR2, which may be viewed from an outside, may be prevented from occurring.

Figure 25:
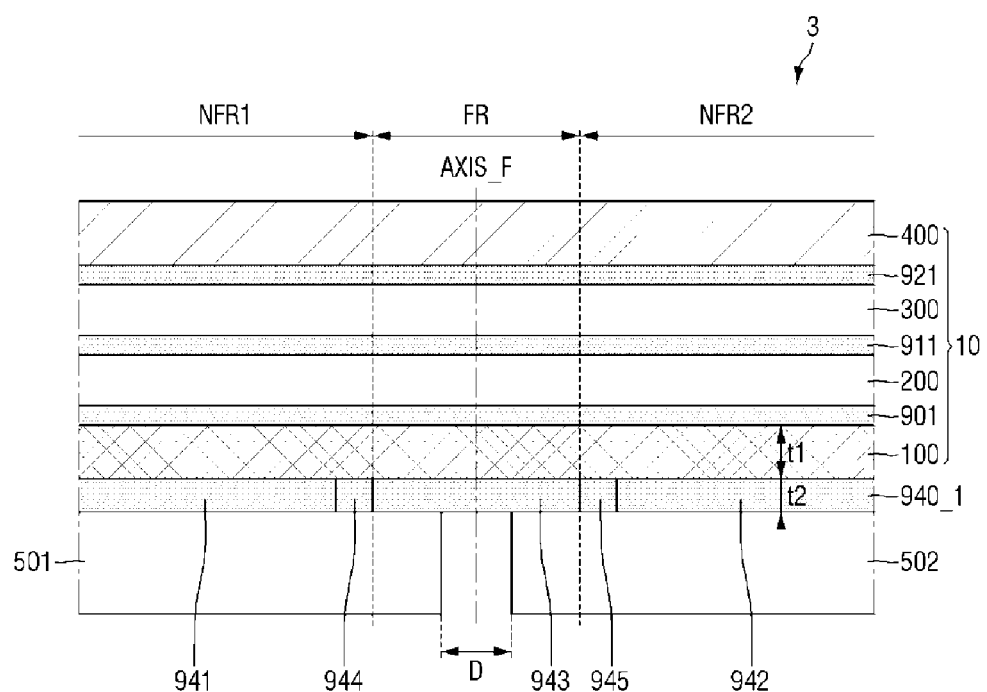
FIG. 25 is a cross-sectional view of a display device according to another alternative embodiment.

FIG. 25 is a cross-sectional view of a display device according to another alternative embodiment.

Referring to FIG. 25, a display device 3 is substantially the same as the above-described display device 1 except that a bonding layer 940_1 further includes a fourth portion between the first portion 941 and the third portion 943 and a fifth portion 945 between the second portion 942 and the third portion 943.

In an embodiment of the display device 3, as shown in FIG. 25, an inner side surface of the first portion 941 may be indented in a direction from the folding region FR toward the first non-folding region NFR1 via the boundary between the first non-folding region NFR1 and the folding region FR, and an inner side surface of the second portion 942 may be indented in a direction from the folding region FR toward the second non-folding region NFR2 via the boundary between the second non-folding region NFR2 and the folding region FR.

The fourth portion 944 may overlap the first non-folding region NFR1, and the fifth portion 945 may overlap the second non-folding region NFR2. Each of the fourth portion 944 and the fifth portion 945 may be disposed in a same layer as the adjacent first portion 941, second portion 942 and third portion 943.

The modulus of each of the fourth portion 944 and the fifth portion 945 may be less than the modulus of the third portion 943, and may be greater than the modulus of each of the first portion 941 and the second portion 942.

The density of the photoinitiator LI in each of the fourth portion 944 and the fifth portion 945 may be greater than the density of the photoinitiator LI in the third portion 943, and may be less than the density of the photoinitiator LI in each of the first portion 941 and the second portion 942.

The bonding force between the other surface of the fourth portion 944 and the first support member 501 may have a value between the fourth bonding force F4 between the first portion 941 and the first support member 501 and the sixth bonding force F6 between the third portion 943 and the first support member 501. The bonding force between the other surface of the fifth portion 945 and the second support member 502 may have a value between the fifth bonding force F5 between the second portion 942 and the second support member 502 and the sixth bonding force F6 between the third portion 943 and the second support member 502.

It is preferred that, at the time of folding the display device 3, the fourth portion 944 and the fifth portion 945, unlike the third portion 943, may have double-sided adhesive force to such a degree that the display device 3 is folded in a state in which the fourth portion 944 and the fifth portion 945 are attached to all the support members 501 and 502 and the lower functional layer 100.

In such an embodiment of the display device 3, since the bonding layer 940_1 further includes the fourth portion 944 and the fifth portion 945 having a value between the adjacent portions, thus coupling failure such as peeling, which may occur when the modulus of the bonding layer 940_1 is greatly changed between the folding region FR and the non-folding regions NFR1 and NFR2, may be effectively prevented.

In such an embodiment, as described above, the bonding force (the sixth bond force F6) between each of the support members 501 and 502 and the third portion 943 of the bonding layer 940_1 disposed in the folding region FR of and each of the support members 501 and 502 is weakened, so that, at the time of folding, the surface of the third portion 943 of the bonding layer is attached to the lower functional layer 100, and the opposite surface of the third portion 943 may be separated from the support members 501 and 502.

Thus, in the folding region FR, bending stress due to the support members 501 and 502 may be effectively prevented from occurring.

In an embodiment of the display device 3, the bonding layer 940_1 may be integrally formed as a single unitary unit over the folding region FR, the first non-folding region NFR1, and the second non-folding region NFR2. Thus, a step difference between the folding region FR and the adjacent non-folding regions NFR1 and NFR2, which may be viewed from an outside, may be prevented from occurring.

As described above, in embodiments of a display device according to the invention, stepped visibility in the folding area is reduced.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device, in which a folding region, a first non-folding region located at a side of the folding region, and a second non-folding region located at another side of the folding region are defined, the display device comprising:

a display module;

a support member disposed on the display module; and
a bonding layer disposed between the display module and the support member,
wherein the support member includes a first support member disposed in the first non-folding region and a part of the folding region, and a second support member disposed in the second non-folding region and a part of the folding region,
the bonding layer is disposed over the folding region, the first non-folding region, and the second non-folding region,
the bonding layer includes a first portion disposed in the first non-folding region, a second portion disposed in the second non-folding region, and a third portion disposed in the folding region, and
an adhesive force of the third portion to the support member is less than each of an adhesive force of the second portion to the first support member and an adhesive force of the second portion to the second support member.

2. The display device of claim 1,
wherein the bonding layer further includes a photoinitiator, and
wherein a density of the photoinitiator in the third portion is less than each of a density of the photoinitiator in the first portion and a density of the photoinitiator in the second portion.

3. The display device of claim 2,
wherein the photoinitiator reacts with light in a wavelength band of about 200 nm to about 350 nm.

4. The display device of claim 1,
wherein the display module includes a display panel and a buffer member disposed between the display panel and the bonding layer,
wherein the buffer member has a thickness in a range of about 100 μm to about 300 μm, and
wherein the bonding layer has a thickness in a range of about 5 μm to about 50 μm.

5. The display device of claim 4, further including:
a support substrate disposed between the bonding layer and the buffer member,
wherein the support substrate is disposed over the folding region, the first non-folding region, and the second non-folding region, and
wherein the support substrate is in contact with the bonding layer.

6. The display device of claim 5,
wherein the support substrate includes polyimide or polyurethane.

7. The display device of claim 5, further comprising:
an upper bonding layer disposed between the buffer member and the support substrate,
wherein the buffer member and the support substrate are coupled with each other through the upper bonding layer.

8. The display device of claim 1,
wherein each of the first support member and the second support member is coupled with the display module through the bonding layer.

9. The display device of claim 8,
wherein the first support member and the second support member are spaced apart from each other by a predetermined distance in the folding region.

10. The display device of claim 9,
wherein an adhesive force between the third portion and the support member in the folding region is less than an adhesive force between the third portion and the display module in the folding region.

11. The display device of claim 10,
wherein when the display device in a folded state, the first support member is attached to the first portion, is separated from the third portion, and the second support member is attached to the second portion, and is separated from the third portion.

12. The display device of claim 1,
wherein a modulus of the third portion is greater than each of a modulus of the first portion and a modulus of the second portion.

13. A method of manufacturing a display device, the method comprising:
preparing a target panel, in which a folding region, a first non-folding region located at a side of the folding region, and a second non-folding region located at another side of the folding region are defined, and providing a buffer member on the target panel;
providing a bonding layer on the buffer member;
masking a portion of the bonding layer overlapping the first non-folding region and the second non-folding region; and
irradiating the folding region with an ultraviolet light.

14. The method of claim 13,
wherein the providing the bonding layer on the buffer member includes:
providing a bonding layer on a substrate;
providing a release film on the bonding layer; and
removing the substrate and attaching an exposed surface of the bonding layer onto the buffer member.

15. The method of claim 14, further comprising:
heating the bonding layer after the providing the bonding layer on the substrate and before the providing the release film on the bonding layer.

16. The method of claim 14, further comprising:
providing a first support member on a surface of the bonding layer in the first non-folding region and providing a second support member on the surface of the bonding layer in the second non-folding region after the attaching the exposed surface of the bonding layer onto the buffer member.

17. The method of claim 13,
wherein the providing the bonding layer on the buffer member includes:
providing a bonding layer on a substrate;
providing a release film on the bonding layer; and
attaching the substrate onto the buffer member through an upper bonding layer.

18. The method of claim 13,
wherein the bonding layer includes a photoinitiator.

19. The method of claim 18,
wherein a density of the photoinitiator in a portion of the bonding layer overlapping the folding region is less than a density of the photoinitiator in the portion of the bonding layer overlapping the first non-folding region and the second non-folding region.

20. The method of claim 18,
wherein a modulus of the photoinitiator in a portion of the bonding layer overlapping the folding region is greater than a modulus of the photoinitiator in the portion of the bonding layer overlapping the first non-folding region and the second non-folding region.

* * * * *